United States Patent [19]

McLellan et al.

[11] Patent Number: 5,661,900
[45] Date of Patent: Sep. 2, 1997

[54] METHOD OF FABRICATING AN ULTRASONICALLY WELDED PLASTIC SUPPORT RING

[75] Inventors: Robert N. McLellan, Garland; Anthony M. Chiu, Richardson; Paul J. Hundt; William K. Dennis, both of Garland, all of Tex.

[73] Assignee: Texas Instruments Incorporated, Dallas, Tex.

[21] Appl. No.: 206,814

[22] Filed: Mar. 7, 1994

[51] Int. Cl.$^6$ .................................................. H01R 43/00
[52] U.S. Cl. ........................... 29/827; 174/52.2; 174/52.4; 438/123
[58] Field of Search ........................... 29/827; 174/52.4, 174/52.2; 437/209, 220

[56] References Cited

U.S. PATENT DOCUMENTS

| | | |
|---|---|---|
| 3,431,637 | 3/1969 | Caracciolo . |
| 3,436,810 | 4/1969 | Kauffman . |
| 3,537,175 | 11/1970 | St. Clair et al. . |
| 3,711,625 | 1/1973 | Du Puis . |
| 4,404,745 | 9/1983 | Resneau et al. ................ 437/216 X |
| 5,338,899 | 8/1994 | Gainey ................ 29/827 X |
| 5,352,633 | 10/1994 | Abbott ................ 437/216 X |

*Primary Examiner*—Carl J. Arbes
*Attorney, Agent, or Firm*—Paul C. Hashim; Wade James Brady; Richard L. Donaldson

[57] ABSTRACT

A method of fabricating a semiconductor device comprising the steps of providing an encapsulated semiconductor device bonded to a lead frame, providing a support ring formed of a material which softens when subjected to one of ultrasonic energy or formed of a material which softens when subjected to heat insufficient to cause sufficient expansion of said lead frame relative to said support ring to cause buckling of the leads of said lead frame, preferably thermoplastic and preferably polyphenylene sulfide, disposing leads of said lead frame over said support ring and causing said leads to embed in said support ring by applying ultrasonic energy to said support ring or by applying heat to said support ring insufficient to cause sufficient expansion of said lead frame relative to said support ring to cause buckling of the leads of said lead frame. The lead frame is preferably formed of gold plated copper, solder plate or tin plate.

12 Claims, 1 Drawing Sheet

5,661,900

METHOD OF FABRICATING AN ULTRASONICALLY WELDED PLASTIC SUPPORT RING

CROSS REFERENCE TO PRIOR APPLICATIONS

This application is related to Ser. No. 08/022,423, filed Feb. 16, 1993, which is a division of Ser. No. 07/576,311, the contents of both of which are incorporated herein by reference.

BACKGROUND OF THE INVENTION

1. Field of the Invention

This invention relates to a support ring for handling and testing semiconductor components assembled by the Tape Automated Bonding (TAB) process and, more specifically, to a procedure for attachment thereof to the lead frame.

2. Brief Description of the Prior Art

When semiconductor devices are assembled in strips on lead frames, the lead frames for several devices are generally connected together in a strip with the semiconductor device then being mounted on the lead frames in standard manner. The semiconductor device are then encapsulated with plastic while a plastic support for the leads of the lead frame from each of the dice is simultaneously formed which is spaced from and surrounding each of the device. The lead frames are generally formed of gold plated copper though solder plate or tin plate is also common.

With the continued miniaturization of semiconductor devices, the leads of the lead frame are continually diminished in both width and thickness. Therefore, due to the difference in the coefficients of expansion between the plastic and the lead frame material, the lead portion of the lead frames extending from the device to the support ring have tended to buckle due to the heat applied thereto during the plastic encapsulation and support ring formation. Accordingly, when the semiconductor device fabrication and testing have been completed and the lead frame has been severed between the support ring and the semiconductor device in standard manner, the leads extending from the semiconductor device are out of alignment. This presents an obvious problem for later use of the semiconductor device in placement and attachment on printed circuit boards and the like.

SUMMARY OF THE INVENTION

In accordance with the present invention, the above noted problems of the prior art are minimized and there is provided a semiconductor device which can be of small dimension and wherein there is no thermal expansion problem to cause buckling of the leads upon removal of the support ring.

Briefly, the above is accomplished by encapsulating the device in a step separate from the formation of the support ring and by forming the support ring under conditions of low heat so that there is no expansion of the leads of the lead frame during support ring formation. The dice are initially bonded to the lead frame in standard manner and then encapsulated. The support ring is then formed or is premolded, the support ring being of a material which softens under heat which is sufficiently low so as not to cause appreciable expansion of the leads of the lead frames or which softens when exposed to ultrasonic energy without any material increase in temperature. A typical material which can be used to form the support ring is polyphylene sulfide (Ryton). The support ring is then heated slightly, as required, or exposed to ultrasonic energy which causes the support ring to soften. This permits the leads of the lead frame to become embedded in the support ring under the pressure of the application tool, yet exposed to be available for contact during the testing procedure. The result is that the support ring is available and the problem of buckling is avoided.

As a second embodiment, a second support ring can be provided on the opposing side of the lead frame and over the first support ring. In this case, the second support ring will preferably, but not necessarily be smaller than the first support ring in the event contact to the lead frame for testing is to be made over the first support ring so that some of the lead frame thereover is exposed.

DESCRIPTION OF THE PREFERRED EMBODIMENTS

Figure 1:
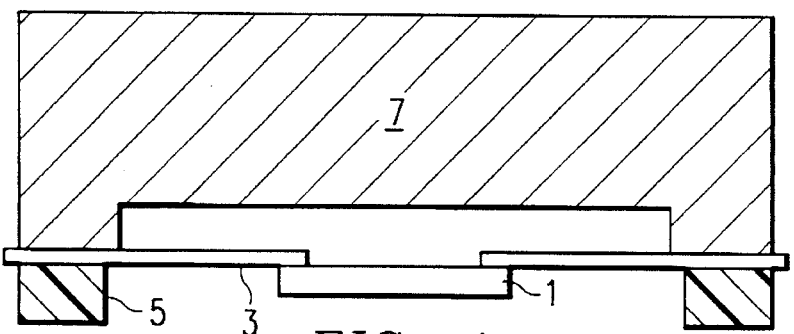
FIG. 1 is a cross-sectional view showing a support ring in accordance with the present invention being welded to a lead frame in accordance with the present invention.
Figure 2:
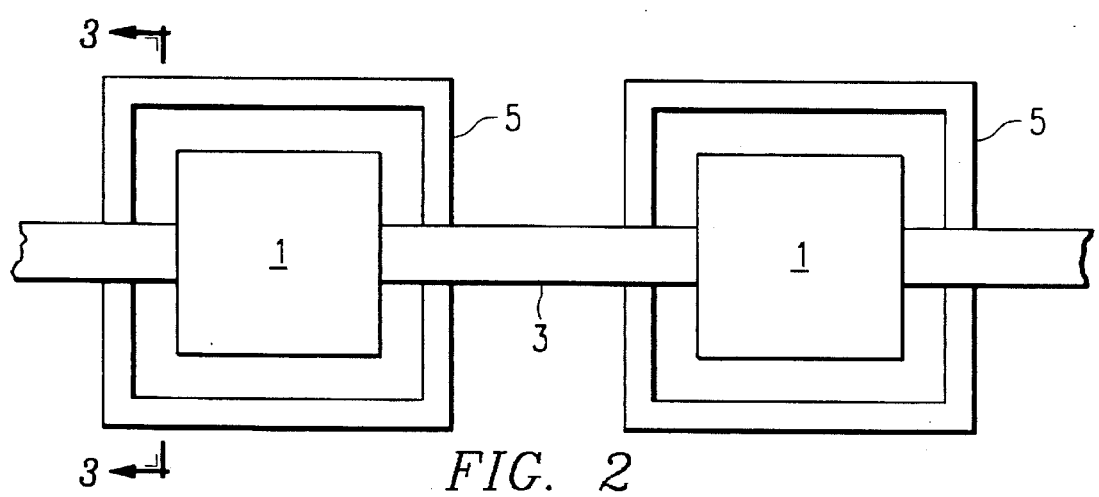
FIG. 2 is a top view of a plurality of encapsulated device secured in a strip to a lead frame with a support ring around and spaced from each of the encapsulated device.
Figure 3:
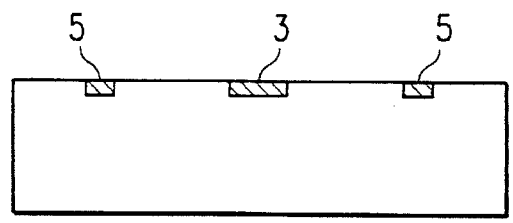
FIG. 3 is a view taken along the line 3—3 of FIG. 2.

Referring first to FIG. 1, there is shown a previously encapsulated die or bonded chip 1 which is welded to a lead frame 3. The lead frame 3 can be in the form of a strip with many spaced apart bonded chips 1 thereon, only one of which is shown. A molded ring 5 which is formed of Ryton is positioned around each of the chips 1 and is spaced from its associated chip so that a portion of the lead frame extends between the chip and the ring, the leads of the lead frame resting on the ring. An ultrasonic welding head 7 is then brought down onto the lead frame over the ring 5 and provides ultrasonic energy to the ring to cause the ring to soften at its upper surface and permit the leads of the lead frame supported thereon to sink into the ring, yet be exposed for contact thereto. The result is a plurality of semiconductor devices 1 in a strip, each semiconductor device having a support ring 5 therearound with the leads of the lead frame 3 extending over and embedded in the ring as shown in FIGS. 2 and 3. Since no appreciable heat is present during the bonding of the leads of the lead frame to the support ring, there is no post assembly movement of the leads of the lead frame relative to the support ring due to the differences in coefficient of thermal expansion, hence no buckling of the leads takes place when the leads are later severed from the support ring.

Figure 4:
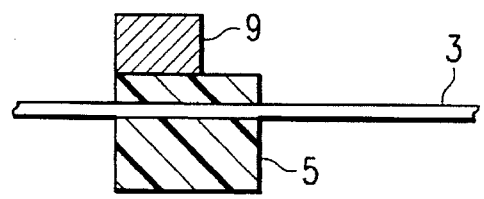
FIG. 4 is a cross sectional view in accordance with a second embodiment of the present invention.

Referring now to FIG. 4, there is shown a second embodiment of the invention wherein a second support ring 9 is disposed over the first support ring 5. The second support ring 9 is preferably of smaller dimension in a direction along the leads of the lead frame in the event contact to the leads of the lead frame during testing is to be made over the first support ring.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A method of fabricating a semiconductor device comprising the steps of:
   (a) providing an encapsulated semiconductor device bonded to a lead frame;
   (b) providing a support ring formed of a material which softens when subjected to ultrasonic energy;
   (c) disposing leads of said lead frame over said support ring;
   (d) ultrasonically conditioning at least a portion of said support ring underlying said lead frame leads to soften said support ring; and
   (e) applying pressure to said lead frame leads so as to embed said leads beneath a surface of said softened lead frame.

2. The method of claim 1 wherein said material forming said support ring is thermoplastic.

3. The method of claim 1 wherein said material forming said support ring is polyphenylene sulfide.

4. The method of claim 1 wherein said lead frame is formed of one of gold plated copper, solder plate or tin plate.

5. The method of claim 2 wherein said lead frame is formed of gold plated copper, solder plate or tin plate.

6. The method of claim 3 wherein said lead frame is formed of gold plated copper, solder plate or tin plate.

7. A method of fabricating a semiconductor device comprising the steps of:
   (a) providing an encapsulated semiconductor device bonded to a lead frame;
   (b) providing a support ring formed of a material which softens, but does not melt, when subjected to heat insufficient to cause sufficient expansion of said lead frame relative to said support ring to cause buckling of the leads of said lead frame;
   (c) disposing leads of said lead frame over said support ring; and
   (d) applying heat to said support ring in quantity sufficient to cause softening of said support ring but not thermal expansion of said lead frame; and
   (e) applying pressure to said lead frame leads so as to embed said leads beneath a surface of said softened lead frame.

8. The method of claim 7 wherein said material forming said support ring is thermoplastic.

9. The method of claim 7 wherein said material forming said support ring is polyphenylene sulfide.

10. The method of claim 7 wherein said lead frame is formed of gold plated copper, solder plate or tin plate.

11. The method of claim 8 wherein said lead frame is formed of gold plated copper, solder plate or tin plate.

12. The method of claim 9 wherein said lead frame is formed of gold plated copper, solder plate or tin plate.

* * * * *